United States Patent
Oda et al.

(10) Patent No.: US 11,063,205 B2
(45) Date of Patent: Jul. 13, 2021

(54) VIBRATION ACTUATOR AND METHOD FOR MANUFACTURING THE SAME

(71) Applicant: CANON KABUSHIKI KAISHA, Tokyo (JP)

(72) Inventors: Yuki Oda, Yokohama (JP); Shinji Yamamoto, Yokohama (JP); Akio Atsuta, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 638 days.

(21) Appl. No.: 15/842,709

(22) Filed: Dec. 14, 2017

(65) Prior Publication Data
US 2018/0108830 A1    Apr. 19, 2018

Related U.S. Application Data

(60) Continuation of application No. 14/132,668, filed on Dec. 18, 2013, now Pat. No. 10,580,963, which is a
(Continued)

(30) Foreign Application Priority Data

Mar. 23, 2010    (JP) .............................. JP2010-065587

(51) Int. Cl.
*H01L 41/35* (2013.01)
*H02N 2/00* (2006.01)
(Continued)

(52) U.S. Cl.
CPC .............. *H01L 41/35* (2013.01); *H01L 41/27* (2013.01); *H01L 41/311* (2013.01); *H02N 1/008* (2013.01);
(Continued)

(58) Field of Classification Search
CPC ...... H02N 2/0055; H02N 2/001; H02N 2/005; H02N 2/0065; H02N 2/163; H02N 2/12; H01L 41/35; H01L 41/311
See application file for complete search history.

(56) References Cited

U.S. PATENT DOCUMENTS

| 2005/0134146 A1* | 6/2005 | Mattsson | H02N 2/0015 310/328 |
| 2009/0167111 A1* | 7/2009 | Mori | H02N 2/026 310/323.16 |

(Continued)

*Primary Examiner* — Bryan P Gordon
(74) *Attorney, Agent, or Firm* — Canon U.S.A., Inc., IP Division

(57) ABSTRACT

A vibration actuator includes an elastic body on which at least one projection is formed and a vibrating body including an electromechanical conversion device, and drives a driven member that is in contact with a contact portion of the projection by causing an end portion of the projection to perform an ellipsoidal movement in response to a combination of two vibration modes generated in the vibrating body when an alternating driving voltage is applied. The elastic body is formed integrally with the projection and a bonding portion between the projection and the electromechanical conversion device. A space is provided between the contact portion and the electromechanical conversion device to which the projection is bonded. The spring portion is provided between the bonding portion and the contact portion and causes the projection to exhibit a spring characteristic when the contact portion is pressed by the driven member.

29 Claims, 9 Drawing Sheets

Related U.S. Application Data division of application No. 13/052,989, filed on Mar. 21, 2011, now Pat. No. 8,633,632.

(51) Int. Cl.
*H02N 1/00* (2006.01)
*H02N 2/12* (2006.01)
*H02N 2/16* (2006.01)
*H01L 41/311* (2013.01)
*H01L 41/27* (2013.01)

(52) U.S. Cl.
CPC .......... *H02N 2/001* (2013.01); *H02N 2/005* (2013.01); *H02N 2/006* (2013.01); *H02N 2/0055* (2013.01); *H02N 2/0065* (2013.01); *H02N 2/12* (2013.01); *H02N 2/16* (2013.01); *H02N 2/163* (2013.01); *H02N 2/22* (2013.01); *Y10T 29/42* (2015.01); *Y10T 29/49* (2015.01)

(56) References Cited

U.S. PATENT DOCUMENTS

2011/0227453 A1* 9/2011 Araki ................. H02N 2/0015
 310/323.02
2011/0241488 A1* 10/2011 Kimura ................. H02N 2/026
 310/323.16
2013/0140952 A1* 6/2013 Kamijo ................. B25J 15/0009
 310/328

* cited by examiner

MODE A

MODE B

VIBRATION ACTUATOR AND METHOD FOR MANUFACTURING THE SAME

CROSS-REFERENCE TO RELATED APPLICATIONS

This application is a continuation of U.S. patent application Ser. No. 14/132,668 filed Dec. 18, 2013, which is a divisional of U.S. patent application Ser. No. 13/052,989 filed Mar. 21, 2011, now U.S. Pat. No. 8,633,632, issued Jan. 21, 2014, all of which claim the benefit of Japanese Patent Application No. 2010-065587 filed Mar. 23, 2010, and all of which are hereby incorporated by reference herein in their entirety.

BACKGROUND OF THE INVENTION

Field of the Invention

The present invention relates to vibration actuators and methods for manufacturing the vibration actuators. More particularly, the present invention relates to a vibration actuator including a substantially rectangular planar vibrator having a projection that serves as a friction member on one side thereof and a method for manufacturing the vibration actuator.

Description of the Related Art

Various vibration actuators that linearly drive driven members have been proposed. For example, U.S. Pat. No. 7,109,639 proposes a vibration-type driving apparatus. The driving principle of the apparatus will be described with reference to FIGS. 11, 12A, and 12B. Referring to FIG. 11, a vibrator 106 is provided with an electromechanical conversion device 107 bonded thereto. FIGS. 12A and 12B illustrate two bending vibration modes of the piezoelectric vibrator. The vibration mode illustrated in FIG. 12A is one of the two bending vibration modes (hereinafter called mode A). Mode A is the second-order bending mode in the long-side direction of the rectangular vibrator 106 (direction shown by arrow X), and has three nodes that are parallel to the short-side direction (direction shown by arrow Y). Projections 108 are located near the nodes of the mode A vibration, and reciprocate in the direction shown by arrow X in response to the mode A vibration. The vibration mode illustrated in FIG. 12B is the other one of the two bending vibration modes (hereinafter called mode B). Mode B is the first-order bending mode in the short-side direction of the rectangular vibrator 106 (direction shown by arrow Y), and has two nodes that are parallel to the long-side direction (direction shown by arrow X).

The nodes in mode A and the nodes in mode B are substantially orthogonal to each other in the XY plane. The projections 108 are located near the antinode of the mode B vibration, and reciprocate in the direction shown by arrow Z in response to the mode B vibration. An end portion of each projection 108 performs an ellipsoidal movement when the vibrations of mode A and mode B are generated at a predetermined phase difference. A slider 116, which serves as a driven member, is in pressure contact with the end portions of the projections 108, as shown in FIG. 11. The slider 116 can be moved in the direction shown by arrow L in response to the ellipsoidal movement of each projections 108.

In this ultrasonic motor, the driven member is brought into pressure contact with the vibrator that vibrates, so that the driven member moves relative to the vibrator in response to the vibration. Accordingly, there is a possibility that an abnormal noise will be generated as the driven member hops in response to the vibration of the vibrator. In addition, there is also a possibility that the stability of the relative movement will be reduced. To overcome these disadvantages, it is necessary to provide an elastic deformable portion that can effectively receive the vibration from the vibrator. For example, Japanese Patent Laid-Open No. 2006-174549 proposes a vibration wave driving apparatus in which spaces are provided in a surface at the side opposite to the projections, as illustrated in FIG. 13. Referring to FIG. 13, in this apparatus, a vibration actuator 207 includes a vibrator 206 and a slider 204, and the vibrator 206 includes an electromechanical conversion device 203, an elastic member 201, and projections 202 bonded to the elastic member 201. Spaces 205 are formed in a bonding surface of the elastic member 201 that is bonded to the electromechanical conversion device 203 at areas opposite to the bonding areas at which the projections 202 are bonded. The area of each space 205 is larger than the bonding area of each projection 202. Therefore, portions of the elastic member 201 at which the spaces 205 are formed function as diaphragms and are elastically deformed, thereby providing a function as springs.

In the above-described structure according to Japanese Patent Laid-Open No. 2006-174549, elastic deformable portions are provided for receiving the vibration from the vibrator. Accordingly, the abnormal noise can be somewhat reduced and the stability of the relative movement can be increased. However, this structure has the following problem. That is, since the projections are provided as separate components and are bonded to the planar elastic member, there is a risk that the projections will be slightly displaced. As a result, there is a possibility that the desired spring stiffness cannot be obtained or the desired performance cannot be achieved by the actuator. In addition, since the number of manufacturing steps is increased, high costs are incurred.

SUMMARY OF THE INVENTION

The present invention provides a vibration actuator which has a stable spring stiffness and which can be easily manufactured. The present invention also provides a method for manufacturing the vibration actuator.

According to an aspect of the present invention, a vibration actuator includes an elastic body on which at least one projection is formed; and a vibrating body including an electromechanical conversion device. The vibration actuator drives a driven member that is in contact with a contact portion of the projection by causing an end portion of the projection to perform an ellipsoidal movement in response to a combination of two vibration modes generated in the vibrating body when an alternating driving voltage is applied to the electromechanical conversion device. The elastic body is formed integrally with the projection and a bonding portion between the projection and the electromechanical conversion device. A space is provided between the contact portion and the electromechanical conversion device to which the projection is bonded. The projection includes a standing portion that connects the contact portion and a spring portion to each other. The spring portion has a smaller thickness than thicknesses of the contact portion, the standing portion, and the bonding portion between the projection and the electromechanical conversion device. The spring portion is provided between the bonding portion between the projection and the electromechanical conversion device and the contact portion, the spring portion causing the projection to exhibit a spring characteristic when the contact portion is pressed as a result of the contact with the driven member. Another aspect of the present invention provides a method for manufacturing a vibration actuator including an elastic body on which at least one projection is formed and a vibrating body including an electromechanical conversion device, the vibration actuator driving a driven member that is in contact with a contact portion of the projection by causing an end portion of the projection to perform an ellipsoidal movement in response to a combination of two vibration modes generated in the vibrating body when an alternating driving voltage is applied to the electromechanical conversion device. The method includes forming the elastic body integrally with the projection and a bonding portion between the projection and the electromechanical conversion device by press working. To form a space and a spring portion having a spring characteristic in the projection at a position between the bonding portion between the projection and the electromechanical conversion device and the contact portion, the method further comprises forming a standing portion that connects the contact portion and the spring portion to each other and forming the spring portion such that the spring portion has a small thickness that is smaller than thicknesses of the contact portion, the standing portion, and the bonding portion between the projection and the electromechanical conversion device, or forming a standing portion between the bonding portion between the projection and the electromechanical conversion device and the contact portion so as to connect the bonding portion and the contact portion to each other and forming at least one hole in the standing portion. The step of forming the spring portion having the small thickness or the step of forming the at least one hole in the standing portion is performed when the elastic body is formed integrally with the projection and the bonding portion between the projection and the electromechanical conversion device by press working.

According to the present invention, a vibration actuator which has a stable spring stiffness and which can be easily manufactured and a method for manufacturing the vibration actuator are provided.

Further features of the present invention will become apparent from the following description of exemplary embodiments with reference to the attached drawings.

DETAILED DESCRIPTION OF THE EMBODIMENTS

The structure according to embodiments of the present invention will now be described. The structure includes an elastic body on which at least one projection is formed and a vibrating body having an electromechanical conversion device. A driven member that is in contact with a contact portion of the projection is driven by an ellipsoidal movement of an end portion of the projection. The ellipsoidal movement is generated in response to a combination of two vibration modes generated in the vibrating body when an alternating driving voltage is applied to the electromechanical conversion device. In vibration actuators according to the embodiments, the elastic body is formed integrally with the projection and a bonding portion between the projection and the electromechanical conversion device by press working. Therefore, variations due to individual differences are small and stable performance can be achieved. In addition, the vibration actuators can be easily manufactured since the number of manufacturing steps is small. Therefore, the costs can be reduced. The projection is provided with a spring portion that causes the projection to exhibit a spring characteristic when the contact portion is pressed as a result of the contact with the driven member. The spring portion is disposed between the bonding portion between the projection and the electromechanical conversion device and the contact portion. A standing portion is formed so as to connect the contact portion and the spring portion to each other, the spring portion having a smaller thickness than those of the contact portion, the standing portion, and the bonding portion between the projection and the electromechanical conversion device. A space is provided between the contact portion, standing portion, spring portion and the electromechanical conversion device to which the projection is bonded. Alternatively, a standing portion is formed so as to connect the bonding portion between the projection and the electromechanical conversion device and the contact portion to each other, and at least one hole is formed in the standing portion. When the contact portion is pressed as a result of the contact with the driven member, the projection elastically deforms and exhibits a spring characteristic.

First Embodiment

Figure 1A:
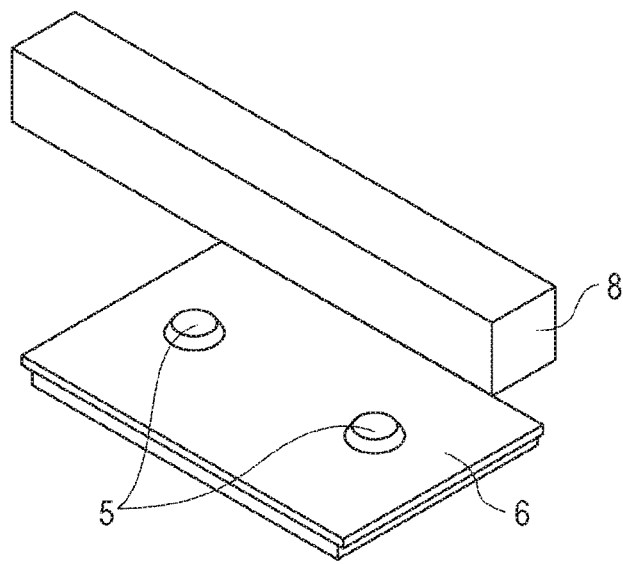
FIGS. 1A and 1B illustrate the structure of a vibration actuator according to a first embodiment of the present invention.
Figure 1B:
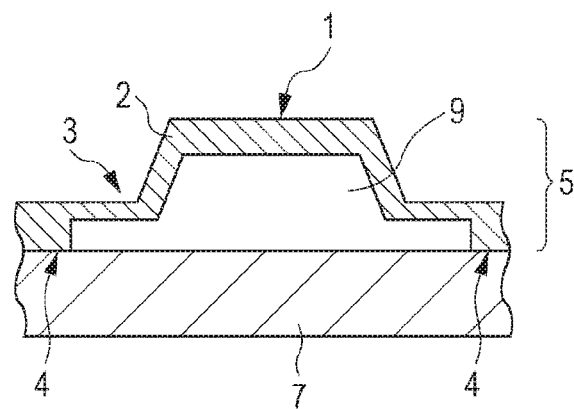

The structure of a vibration actuator according to a first embodiment of the present invention will be described with reference to FIGS. 1A and 1B. FIG. 1A is a perspective view of the vibration actuator according to the present embodiment, and FIG. 1B is a sectional view of a single projection. As illustrated in FIG. 1A, the vibration actuator according to the present embodiment includes a vibrating body including projections 5 and an elastic body 6 and a driven member 8. As illustrated in FIG. 1B, each projection 5 includes a contact portion 1 between the elastic body 6 and the driven member 8, a spring portion 3 that reduces the vibration stiffness of the vibrating body in the direction in which a pressure is applied, and a standing portion 2 that connects the contact portion 1 and the spring portion 3 to each other. The elastic body 6 includes bonding portions 4 between the projections 5 and an electromechanical conversion device 7.

The elastic body 6 is formed integrally with each projection 5, and a space 9 is provided between the electromechanical conversion device 7 and the contact portion 1 of each projection 5. In each projection 5, the thickness of the spring portion 3 is smaller than those of the contact portion 1, the standing portion 2, and the bonding portion 4 between the projection 5 and the electromechanical conversion device 7. In the present embodiment, the spring portion 3 may be formed together with the contact portion 1, the standing portion 2, and the bonding portion 4 between the projection 5 and the electromechanical conversion device 7 when the elastic body 6 is formed by press working. Alternatively, the spring portion 3 may be formed after the elastic body 6 is formed integrally with each projection 5 and the bonding portion 4 between the projection 5 and the electromechanical conversion device 7 by press working. More specifically, the contact portion 1, the standing portion 2, and the bonding portion 4 between the projection 5 and the electromechanical conversion device 7 are formed in advance by press working. Then, the spring portion 3 may be additionally formed by electric discharge machining or the like such that the thickness of the spring portion 3 is smaller than those of the contact portion 1, the standing portion 2, and the bonding portion 4 between the projection 5 and the electromechanical conversion device 7. In the present embodiment, the spring portion 3 is formed by electric discharge machining. However, the spring portion 3 may instead be formed by etching or cutting.

Figure 2:
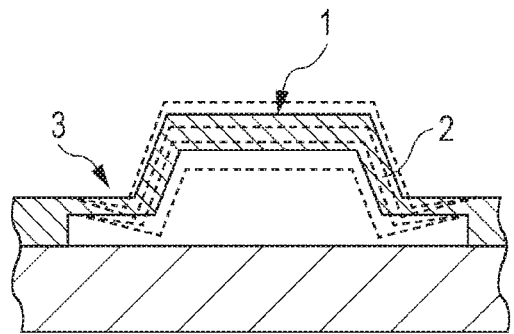
FIG. 2 is a diagram illustrating a spring-like movement of a projection according to the first embodiment of the present invention.
Figure 3A:
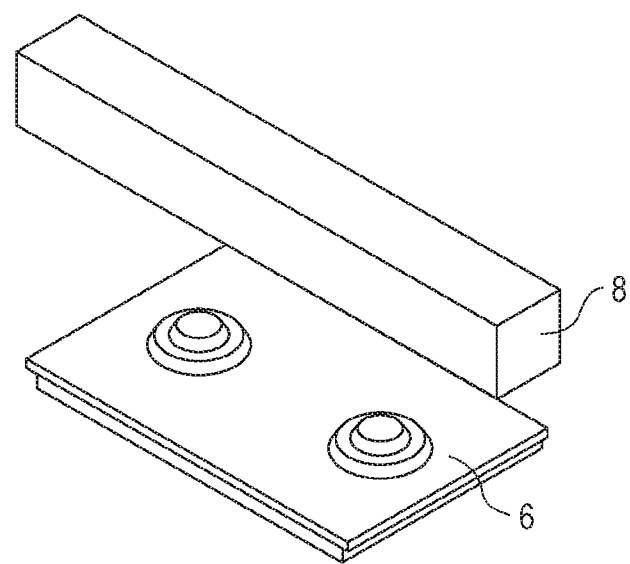
FIGS. 3A and 3B illustrate the structure of a modification of the vibration actuator according to the first embodiment of the present invention.
Figure 3B:
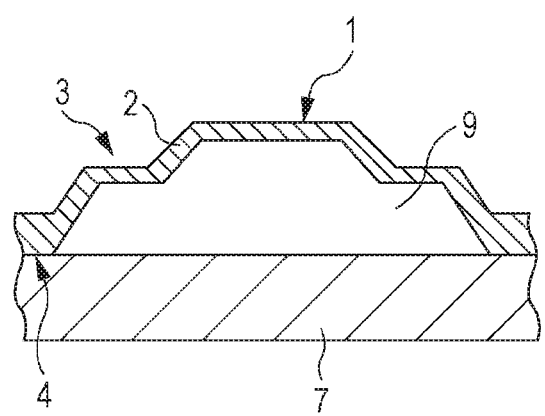

In the above-described structure, when a force is applied to the contact portion 1, the spring portion 3, which is thinner than the contact portion 1, the standing portion 2, and the bonding portion 4 between the projection 5 and the electromechanical conversion device 7, functions as a diaphragm, as illustrated in FIG. 2. Accordingly, each projection 5 elastically deforms and exhibits a spring characteristic. As illustrated in FIGS. 3A and 3B, each projection may have a two-step structure. In this case, the distance between the spring portion 3 and the electromechanical conversion device 7 is increased. As a result, an adhesive used to attach the elastic body 6 to the electromechanical conversion device 7 does not easily adhere to the spring portion 3.

Second Embodiment

Figure 4A:
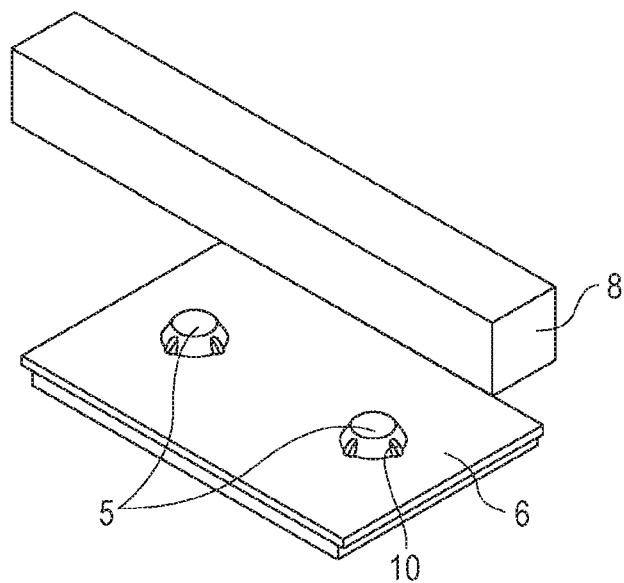
FIGS. 4A and 4B illustrate the structure of a vibration actuator according to a second embodiment of the present invention.
Figure 4B:
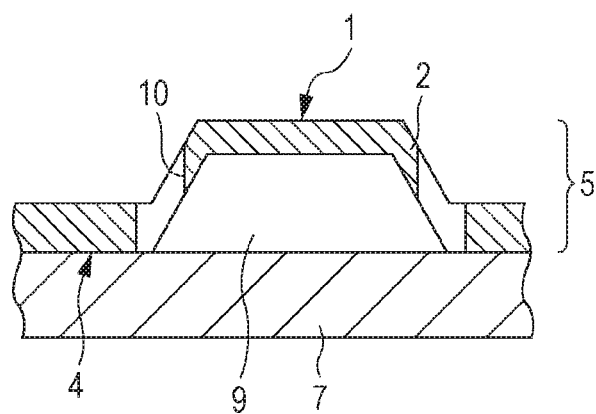

The structure of a vibration actuator according to a second embodiment of the present invention will be described with reference to FIGS. 4A and 4B. FIG. 4A is a perspective view of the vibration actuator according to the present embodiment, and FIG. 4B is a sectional view of a single projection. As illustrated in FIG. 4A, the vibration actuator according to the present embodiment includes a vibrating body including projections 5, an elastic body 6, and a plurality of holes 10 formed in the elastic body 6 and a driven member 8. As illustrated in FIG. 4B, each projection 5 includes a contact portion 1 between the elastic body 6 and the driven member 8, a standing portion 2 that connects the contact portion 1 and an electromechanical conversion device 7 to each other, and the holes 10 formed in the standing portion 2. Although four holes 10 are formed in the present embodiment, the number of holes is not limited as long as the number is 1 or more. The shape of the holes 10 may be circular, oblong circular, or an arc shape that extends along the shape of each projection 5. The elastic body 6 includes bonding portions 4 between the projections 5 and an electromechanical conversion device 7.

Figure 5:
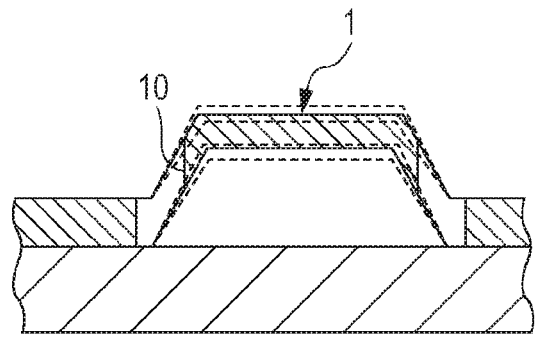
FIG. 5 is a diagram illustrating a spring-like movement of a projection according to the second embodiment of the present invention.

In the present embodiment, the holes 10 may be formed together with the contact portion 1, the standing portion 2, and the bonding portion 4 between the projection 5 and the electromechanical conversion device 7 when the elastic body 6 is formed by press working. Alternatively, the holes 10 may be formed by electric discharge machining or the like after the contact portion 1, the standing portion 2, and the bonding portion 4 between the projection 5 and the electromechanical conversion device 7 are formed by press working. In the present embodiment, the holes 10 are formed by electric discharge machining. However, the holes 10 may instead be formed by etching or cutting. In the above-described structure, when a force is applied to the contact portion 1, portions around the holes 10 elastically deform and exhibit a spring characteristic, as illustrated in FIG. 5. This is because the portions around the holes 10 have a lower stiffness than those of the contact portion 1, the standing portion 2, and the bonding portion 4 between the projection 5 and the electromechanical conversion device 7.

Third Embodiment

Figure 6A:
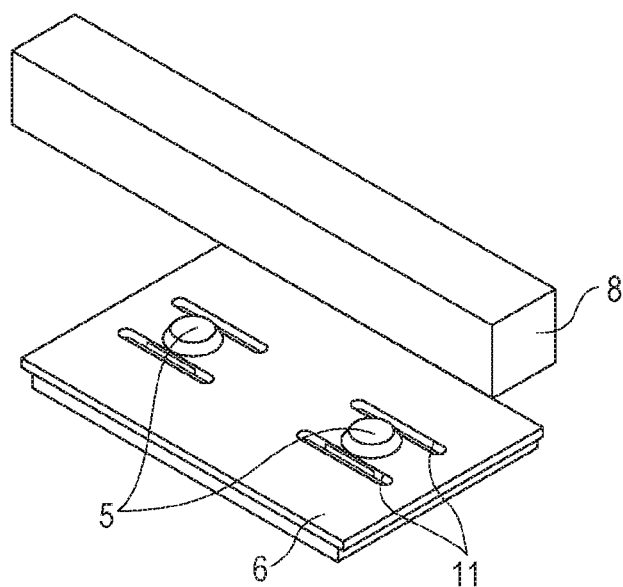
FIGS. 6A and 6B illustrate the structure of a vibration actuator according to a third embodiment of the present invention.
Figure 6B:
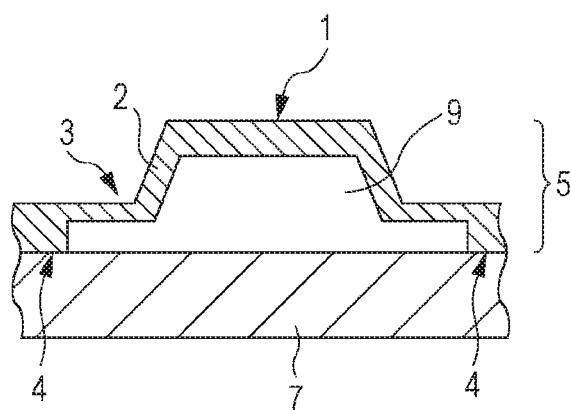

The structure of a vibration actuator according to a third embodiment of the present invention will be described with reference to FIGS. 6A and 6B. FIG. 6A is a perspective view of the vibration actuator according to the present embodiment, and FIG. 6B is a sectional view of a single projection. Referring to FIG. 6A, the vibration actuator includes a vibrating body including projections 5 and an elastic body 6 and a driven member 8. The vibrating body is provided with elongate holes 11 that receive excess portions generated during press working. As illustrated in FIG. 6B, in the vibration actuator according to the present embodiment, each projection 5 includes a contact portion 1 between the elastic body 6 and the driven member 8, a spring portion 3 that reduces the vibration stiffness of the vibrating body in the direction in which a pressure is applied, and a standing portion 2 that connects the contact portion 1 and the spring portion 3 to each other. The elastic body 6 includes bonding portions 4 between the projections 5 and an electromechanical conversion device 7. The elastic body 6 is formed integrally with each projection 5, and a space 9 is provided between the electromechanical conversion device 7 and the contact portion 1 of each projection 5. In each projection 5, the thickness of the spring portion 3 is smaller than those of the contact portion 1, the standing portion 2, and the bonding portion 4 between the projection 5 and the electromechanical conversion device 7.

Figure 7:
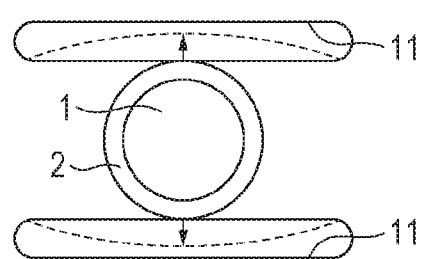
FIG. 7 is a diagram illustrating the manner in which excess portions move according to the third embodiment.
Figure 8A:
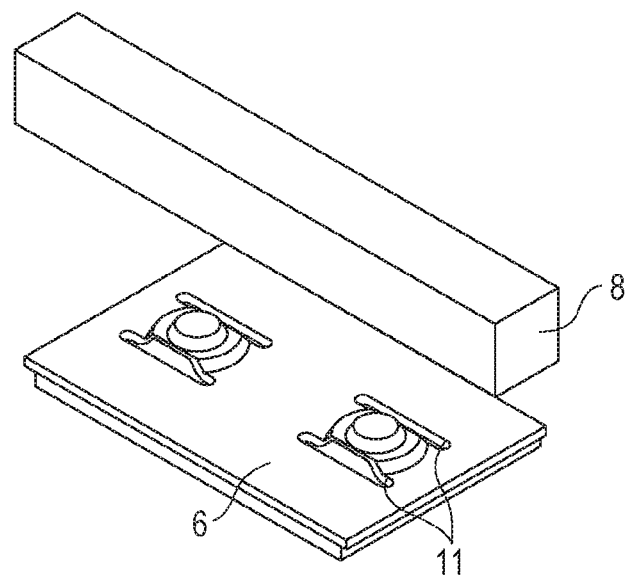
FIGS. 8A and 8B illustrate the structure of a modification of the vibration actuator according to the third embodiment of the present invention.
Figure 8B:
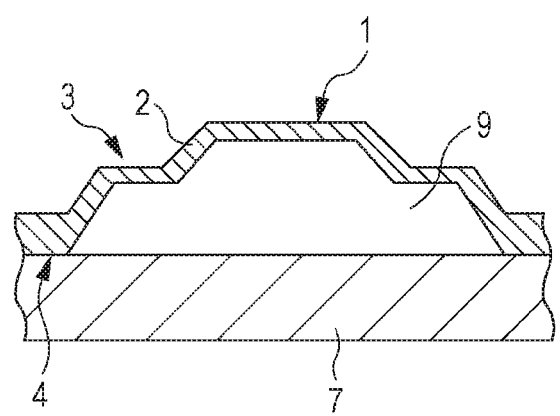

The elongate holes 11 are formed in an area surrounding each projection 5 before the projection 5 is formed. Accordingly, as illustrated in FIG. 7, excess portions generated when each projection 5 is formed by press working are received by the elongate holes 11. Therefore, the contact portion 1, the standing portion 2, the spring portion 3, and the bonding portion 4 between the projection 5 and the electromechanical conversion device 7 can be formed integrally with each other by press working such that the thickness of the spring portion 3 is smaller than that in the case where the elongate holes 11 are not formed. Since the spring portion 3 is thinner than the contact portion 1, the standing portion 2, and the bonding portion 4 between the projection 5 and the electromechanical conversion device 7, the spring portion 3 functions as a diaphragm when a force is applied to the contact portion 1. As illustrated in FIGS. 8A and 8B, each projection may have a two-step structure. In this case, the distance between the spring portion 3 and the electromechanical conversion device 7 is increased. As a result, an adhesive used to attach the elastic body 6 to the electromechanical conversion device 7 does not easily adhere to the spring portion 3.

Forth Embodiment

Figure 9:
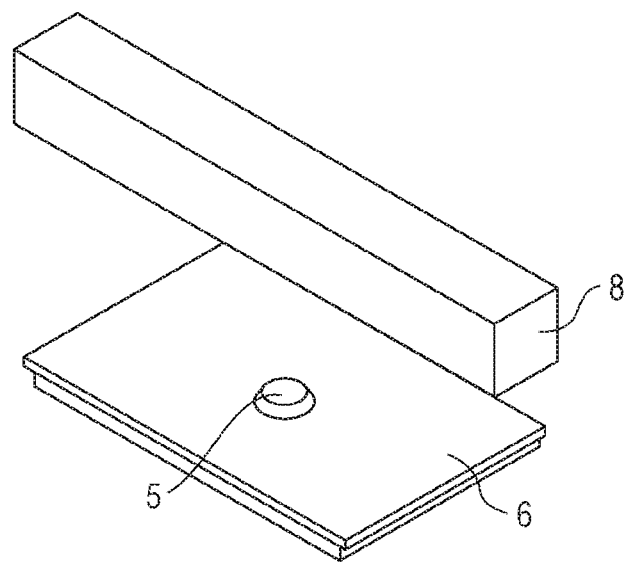
FIG. 9 illustrates the structure of a vibration actuator according to a fourth embodiment of the present invention.

The structure of a vibration actuator according to a forth embodiment of the present invention will be described with reference to FIG. 9. As illustrated in FIG. 9, the vibration actuator according to the present embodiment includes a vibrating body including a projection 5 and an elastic body 6 and a driven member 8. The spring structure is similar to that in the first embodiment. In the present embodiment, a single projection 5 is provided. Since the number of projections 5 is one, the area necessary to arrange the projection 5 is small. Accordingly, the size of the vibration actuator can be reduced. In addition, since the number of projections 5 is one, a multiple degree-of-freedom driving mechanism illustrated in FIG. 10, for example, can be achieved.

Figure 10:
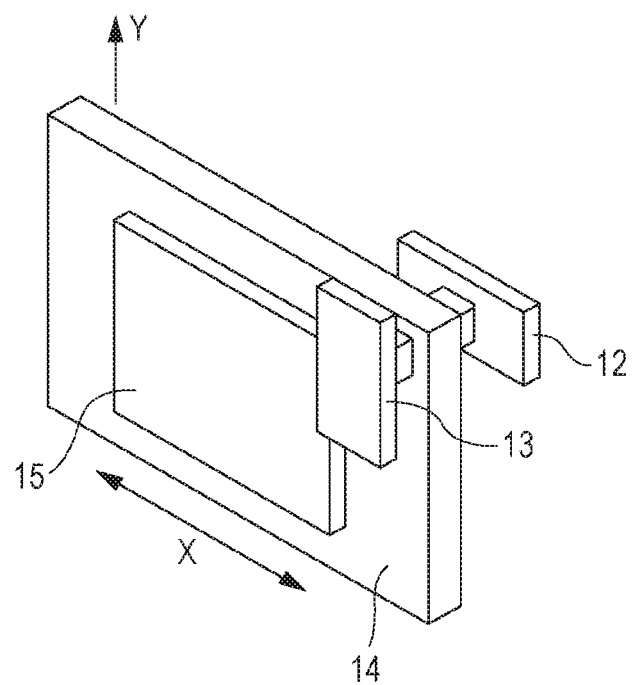
FIG. 10 is a diagram illustrating an example of multiple-degree-of-freedom driving according to the fourth embodiment of the present invention.
Figure 11:
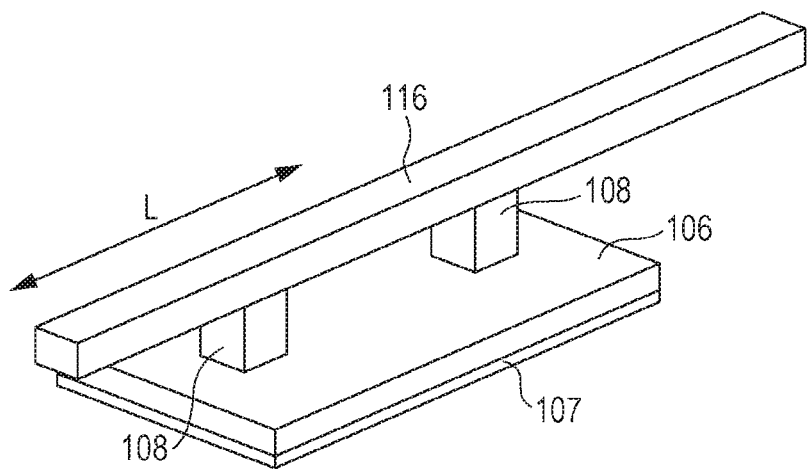
FIG. 11 illustrates the structure of a vibration actuator according to the related art.
Figure 12A:
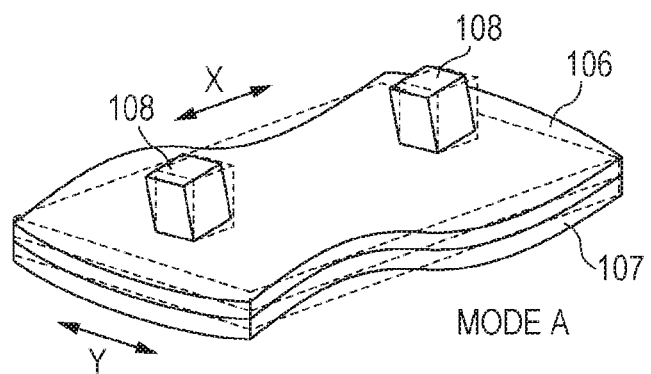
FIGS. 12A and 12B illustrate bending modes of the vibration actuator.
Figure 12B:
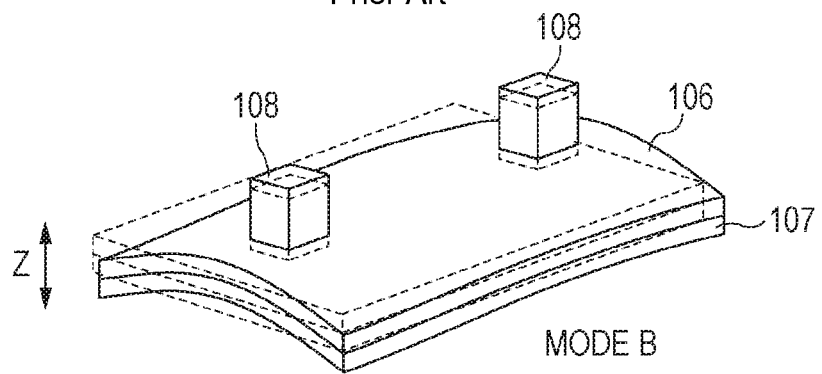
Figure 13:
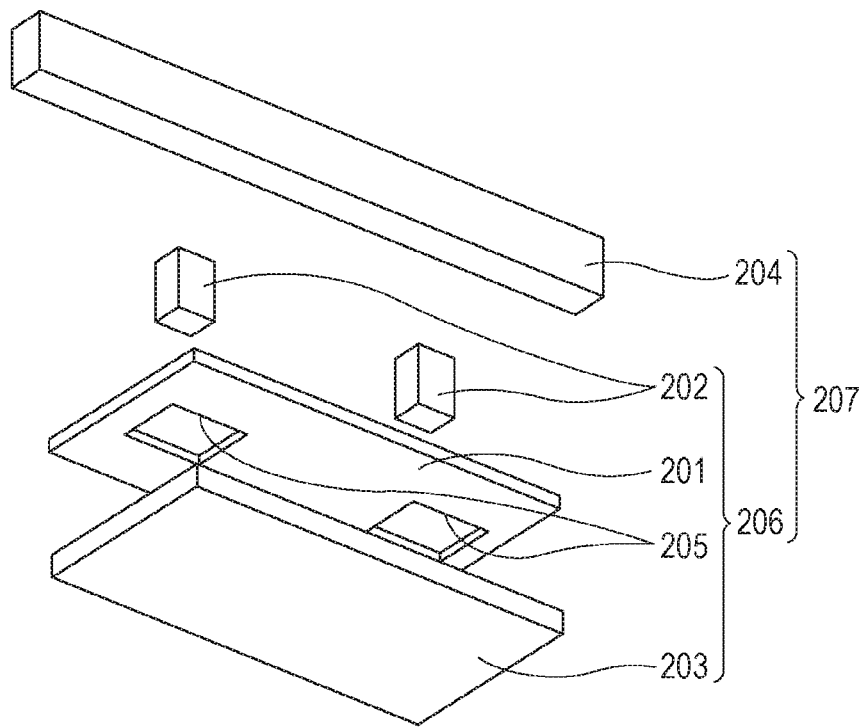
FIG. 13 illustrates the structure of a vibration actuator according to the related art in which spaces are provided in a surface at the side opposite to projections.

The multiple degree-of-freedom driving apparatus illustrated in FIG. 10 includes a pair of vibration actuators 12 and 13 according to the present embodiment. The vibration actuators 12 and 13 drive a moving body 14 that retains a driven member 15, such as a CCD, in X and Y directions. The vibration actuators 12 and 13 are arranged such that projections thereof are in pressure contact with a corner portion of the moving body 14 at the same position so as to sandwich the moving body 14 in the thickness direction. The vibration actuator 12 applies a driving force in the X direction to the moving body 14, and the vibration actuator 13 applies a driving force in the Y direction to the moving body 14. The moving body 14 is guided in the X direction by an X-direction guiding mechanism (not shown) and in the Y direction by a Y-direction guiding mechanism (not shown).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A vibrating body comprising:
   an elastic body including a projection; and
   an electromechanical conversion device bonded to a bonding portion of the elastic body, an alternating voltage being applied to the electromechanical conversion device so that a vibration of a bending vibration mode is generated in the vibrating body,
   wherein the projection comprises:
      a contact portion contacting a driven member;
      a spring portion between the contact portion and the bonding portion; and
      a standing portion between the contact portion and the bonding portion, the standing portion having a ring shape,
   wherein a space surrounded by the standing portion is provided between the contact portion and the electromechanical conversion device, and
   wherein the projection and the bonding portion share one member.

2. The vibrating body according to claim 1, wherein the spring portion and the electromechanical conversion device face each other.

3. The vibrating body according to claim 1, wherein the projection is protruded from a first surface of the elastic body,
   wherein the electromechanical conversion device is bonded to a second surface of the elastic body on the side opposite to the first surface, and
   wherein a distance between the spring portion and the electromechanical conversion device is larger than a distance between the first surface of the elastic body and the electromechanical conversion device.

4. The vibrating body according to claim 1, wherein the bonding portion comprises a portion having a thickness larger than a thickness of the spring portion.

5. The vibrating body according to claim 2, wherein the bonding portion and the electromechanical conversion device are attached with an adhesive, and wherein the spring portion and the electromechanical conversion device face through the adhesive.

6. The vibrating body according to claim 1, wherein a hole is provided on the standing portion.

7. The vibrating body according to claim 1, wherein the ring shape is a circle.

8. The vibrating body according to claim 1, wherein the spring portion has a ring shape.

9. The vibrating body according to claim 1, wherein the elastic body comprises a plurality of the projections.

10. The vibrating body according to claim 1, wherein the elastic body has a planar shape.

11. The vibrating body according to claim 1, wherein the elastic body has a substantially rectangular planar shape.

12. A vibrating body comprising:
    an elastic body including a projection; and
    an electromechanical conversion device bonded to a bonding portion of the elastic body, an alternating voltage being applied to the electromechanical conversion device so that a vibration of a bending vibration mode is generated in the vibrating body,
    wherein the projection comprises:
       a first convex portion, and
       a second convex portion provided on the first convex portion, and
    wherein the first convex portion comprises:
       a sidewall portion having a ring shape, and
       a spring portion between the second convex portion and the side wall portion.

13. The vibrating body according to claim 12, wherein a second convex portion comprises:
    a contact portion contacting a contact member moving relatively to the vibrating body in response to the vibration; and
    a standing portion,
    wherein the standing portion is provided between the contact portion and the first convex portion.

14. A vibration actuator comprising:
    a vibrating body including an elastic body and an electromechanical conversion device; and
    a driven member,
    wherein the vibrating body and the driven member are relatively moved, wherein the elastic body comprises a projection,
wherein the electromechanical conversion device is bonded to a bonding portion of the elastic body, an alternating voltage being applied to the electromechanical conversion device so that a vibration of a bending vibration mode is generated in the vibrating body,
wherein the projection comprises:
a contact portion contacting a driven member,
a spring portion between the contact portion and the bonding portion, and a standing portion between the contact portion and the bonding portion, the standing portion having a ring shape,
wherein a space surrounded by the standing portion is provided between the contact portion and the electromechanical conversion device, and
wherein the projection and the bonding portion share one member.

15. A vibration actuator comprising:
a vibrating body including an elastic body and an electromechanical conversion device; and
a contact member,
wherein the vibrating body and the contact member are relatively moved,
wherein the elastic body comprises a projection,
wherein the electromechanical conversion device is bonded to a bonding portion of the elastic body, an alternating voltage being applied to the electromechanical conversion device so that a vibration of a bending vibration mode is generated in the vibrating body,
wherein the projection comprises:
a first convex portion, and
a second convex portion provided on the first convex portion, and
wherein the first convex portion comprises:
a sidewall portion having a ring shape, and
a spring portion between the second convex portion and the side wall portion.

16. The vibrating body according to claim 1,
wherein the spring portion is between the contact portion and the standing portion, and;
wherein the spring portion is formed in a diaphragm shape.

17. The vibrating body according to claim 16,
wherein the standing portion is protruded from a first surface of the elastic body, and
wherein the electromechanical conversion device is bonded to a second surface of the elastic body on the side opposite to the first surface.

18. The vibrating body according to claim 1,
wherein the standing portion is between the contact portion and the springing portion, and;
wherein the spring portion is formed in a diaphragm shape.

19. The vibrating body according to claim 18,
wherein the standing portion is protruded from a first surface of the elastic body, and
wherein the electromechanical conversion device is bonded to a second surface of the elastic body on the side opposite to the first surface.

20. The vibrating body according to claim 1,
wherein an alternating voltage is applied to the electromechanical conversion device so that vibrations of a plurality of bending vibration modes are generated at a predetermined phase difference.

21. The vibrating body according to claim 12, wherein a space surrounded by the sidewall portion is provided between the second convex portion and the electromechanical conversion device.

22. The vibrating body according to claim 12, wherein the projection and the bonding portion share one member.

23. The vibrating body according to claim 1, wherein the elastic body is formed integrally with the projection by press working.

24. The vibrating body according to claim 12, wherein the elastic body is formed integrally with the projection by press working.

25. The vibration actuator according to claim 14, wherein the elastic body is formed integrally with the projection by press working.

26. The vibration actuator according to claim 15, wherein the elastic body is formed integrally with the projection by press working.

27. The vibrating body according to claim 12, wherein the spring portion has a ring shape.

28. The vibrating body according to claim 12, wherein the elastic body comprises a plurality of the projections.

29. The vibrating body according to claim 12,
wherein the side wall portion is protruded from a first surface of the elastic body, and
wherein the electromechanical conversion device is bonded to a second surface of the elastic body on the side opposite to the first surface.

* * * * *